United States Patent [19]

Cummings et al.

[11] Patent Number: 5,283,746
[45] Date of Patent: Feb. 1, 1994

[54] MANUFACTURING ADJUSTMENT DURING ARTICLE FABRICATION

[75] Inventors: Kevin D. Cummings, Neshanic Station; Robert C. Frye, Piscataway; Edward A. Rietman, Madison, Morris County, all of N.J.

[73] Assignee: AT&T Bell Laboratories, Murray Hill, N.J.

[21] Appl. No.: 23,158

[22] Filed: Feb. 25, 1993

Related U.S. Application Data

[63] Continuation of Ser. No. 483,530, Feb. 22, 1990, abandoned.

[51] Int. Cl.$^5$ .............................................. G06F 15/18
[52] U.S. Cl. ................................... 364/468; 364/148; 364/491; 382/14; 395/21; 395/904
[58] Field of Search .......................... 364/468, 488–491, 364/148, 800, 807, 600, 602, 607; 395/903, 904, 21–27, 921; 382/14, 15; 250/492.1–492.3

[56] References Cited

U.S. PATENT DOCUMENTS

| | | | |
|---|---|---|---|
| 4,479,241 | 10/1984 | Buckley | 364/513 X |
| 4,858,147 | 8/1989 | Conwell | 364/513 |
| 4,912,655 | 3/1990 | Wood | 364/513 |
| 4,933,872 | 6/1990 | Vandenberg et al. | 382/15 X |
| 4,941,122 | 7/1990 | Weideman | 364/513 X |
| 4,989,256 | 1/1991 | Buckley | 364/513 X |

OTHER PUBLICATIONS

Psaltis et al–"A Multilayered Neural Network Controller"–IEEE Control Systems Magazine–1988, Apr., pp. 17–21.
Parikh, M., *J. Vac. Sci. Technol.*, vol. 15, pp. 931 (1978).
Rumelhart, D. E., et al, *Nature*, vol. 323, p. 533 (1986).
*Monte Carlo Calculation*, "Advances in Electronics and Electron Physics," vol. 69, K. Murata and D. F. Kysen, Chapter 11, Monte Carlo Methods and Microlithography Simulation for Electron and X-ray Beams, pp. 175–256, Academic Press, NY, 1987.
*Experimental Means*, D. J. Hughes, R. F. Rix, "Proximity Correction on an Electron Scan E-beam Machine by Dose Variation", Pub. Microelectronic Eng., vol. 9, 1989, pp. 243–246.

*Primary Examiner*—Joseph Ruggiero
*Attorney, Agent, or Firm*—Bruce S. Schneider

[57] ABSTRACT

The use of neural networks has been employed to adjust processing during the fabrication of articles. For example, in the production of photolithographic masks by electron beam irradiation of a mask blank in a desired pattern, electrons scattered from the mask substrate cause distortion of the pattern. Adjustment for such scattering is possible during the manufacturing process by employing an adjustment function determined by a neural network whose parameters are established relative to a prototypical mask pattern.

7 Claims, 4 Drawing Sheets

←| |← 1μ of active devices and impedances, it should be understood that this description is a mathematical representation and the network is generally implemented in software or hardware.

MANUFACTURING ADJUSTMENT DURING ARTICLE FABRICATION

This application is a continuation of application Ser. No. 07/483,530, filed on Feb. 22, 1990, abandoned.

BACKGROUND OF THE INVENTION

1. Field of the Invention

This invention relates to manufacturing processes controlled by electronic processing and, in particular, to manufacturing processes involving adjustment for processing variables.

2. Art Background

A wide variety of manufacturing processes are controlled by electronic data processors such as computers. In such procedures a physical operation such as positioning is controlled by electrical signals that emanate from the data processor and that control processing through expedients such as positioners and/or directors. Exemplary of such processes is electron beam exposure equipment utilized in the fabrication of lithographic masks or integrated circuits where the electron beam is controlled by electric field directors. In such procedures, a chromium covered glass substrate or a device substrate overlain by an electron sensitive material is exposed by irradiation with an electron beam selectively by direction of the electron beam to impact the material in a desired pattern.

After exposure either the irradiated or nonirradiated portions of the electron sensitive material are removed typically through differential solvation processes to uncover in the desired pattern underlying regions of chromium or of the device. The longer the time the beam remains directed to impact a specific point the greater the difference in solvation characteristics between exposed and unexposed regions. The uncovered chromium or device region is then treated by procedures such as etching or metallization. For example, in producing a mask the uncovered chromium is removed to yield transparent regions in a pattern corresponding to that formed in the electron sensitive material. This transparent pattern is then used for photolithographic purposes in the manufacturing of devices such as integrated circuits.

In such processes, steps such as positioning must be adjusted to reflect the variables associated with the article being fabricated. In the example given above, such adjustment emanates from the scattering of impacting electrons off the underlying substrate. Such scattering of electrons produces a secondary exposure in regions adjacent to the areas of initial impact of the electron beam, thus causing a differential solubility between adjacent regions where none is desired or the same solubility where a difference is required.

Adjustment for such effects, especially in complicated systems such as those involved in lithography mask fabrication, requires excessive, uneconomic calculations. For example, in the context of photolithographic mask fabrication there are proposed algorithms such as described by M. Parikh in *J. Vac. Sci. Technol.*, Vol. 15, pp. 931 (1978) for correcting inaccuracies associated with electron scattering. These methods involve inversion of large matrices to find the solutions, and would require years of computer time for a complex pattern. The time and expense associated with extensive calculation precludes such adjustment. Clearly, any improvement which allows adjustment and the associated article improvement with reasonable speed and cost is quite desirable.

SUMMARY OF THE INVENTION

A method of performing adjustment to manufacturing processes without uneconomic calculations is possible by using a neural network in conjunction with a prototypical sampling procedure to set the configuration of the network. In this procedure, the desired adjustment of a process variable(s) is empirically determined for a prototypical sample, and this prototype is then used to determine the configuration of the neural network. The resulting empirically determined neural network configuration is used to determine the adjustment to process variable(s) and the fabrication process is accordingly modified. In the example of photolithographic mask fabrication, a prototypical mask having representative features and configurations found in such masks is used to program the neural network. The resulting configuration that establishes the neural network is then employed to adjust the fabrication procedure, i.e. to correct for exposure resulting from scattered electrons. Surprisingly the use of a prototypical sample to set the configuration of the neural network yields accurate adjustment irrespective of the fabrication procedure ultimately employed, e.g. irrespective of the mask pattern ultimately produced. The invention is particularly advantageous for adjustment of complex processes.

DETAILED DESCRIPTION

Figure 1:
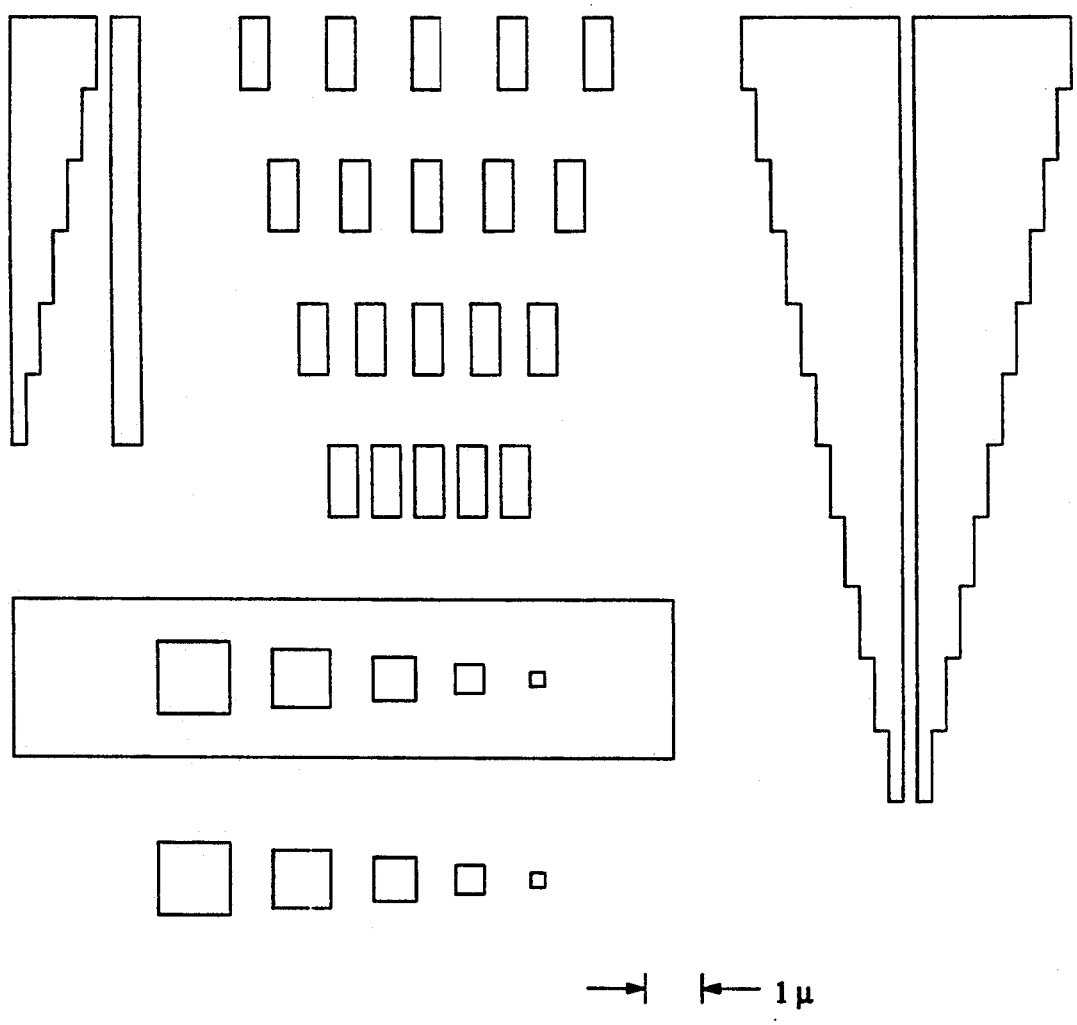
FIG. 1 is illustrative of a prototypical sample suitable for use in the invention.

As discussed in the adjustment of complex processes, a prototypical sample is used to determine the configuration of the neural network. (A complex process is one in which the time required for a computer using conventional serial architecture to adjust the process is at least a factor of two slower than the time required to perform the neural network operations, $P_o$, as defined in this disclosure.) Neural networks are extensively discussed in an article by D. E. Rumelhart, et al. appearing in *Nature*, Vol. 323, page 533 (1986). Basically, these networks include means for inputting a plurality of signals that are representations of a process variable or variables. This data is then caused to interact in a matrix of interconnections where each point of interconnection has an impedance. The data inputs connect to the rows of the matrix, and the columns terminate in an active device, e.g. in a device such as a current summing amplifier or voltage amplifier whose output is a monotonic (linear or non-linear) function of its input. (This description of a neural network contemplates both impedances of zero ohms and infinite impedances at matrix interconnection points.) The output from the active devices is then either 1) fed into subsequent matrix or matrices with their corresponding set(s) of active devices to further operate on the resulting data or 2) terminates at the output. (Although neural networks have been described in terms of active devices and impedances at interconnects, the invention also contemplates neural networks established in software by using mathematical equivalents. These mathematical equivalents are also described in Rumelhart, et al.) The final output results are employed, as previously discussed, to adjust variable(s) in a manufacturing process through control of an appropriate signal controlling the variable(s). (The number of operations performed, $P_o$, in such a network is essentially $2 \times [(i \cdot j) + (j \cdot k) + (k \cdot l) + \ldots]$ where i and j are respectively the number of inputs into the first matrix and the number of associated devices, k is the number of devices associated with the second matrix, l is the number of devices associated with the third matrix and so forth for all matrices present.)

The impedance means at the intersections of the first, and if present, subsequent matrices determine the transformation performed on the input data, and thus determines the output of the neural network. These impedance means are set by using a prototypical sample of the operation ultimately to be performed. Surprisingly the establishment of the impedance values by using a prototypical sample allows the neural network to be used on any sample undergoing the desired fabrication technique provided the non-adjusted parameters of operation are not modified. For example, in the electron beam exposure of a mask, use of a prototypical sample to establish neural network impedance values allows operation on any pattern to be exposed provided the beam acceleration energy and the substrate materials including electron sensitive material and underlying materials are the same. Thus the materials being operated on and the non-adjusted parameters of operation, e.g. the substrate electron sensitive material and exposure energy, if the same, allows use of the neural network established by the prototype on other patterns.

The prototypical sample is chosen so that it has at least as many input-output samples as it has connections (i.e., $i \cdot j + j \cdot k \ldots$). Additionally, the sets should be chosen to span collectively approximately the same region in input space as the processes to be adjusted. (Input space is defined as a multidimensional volume encompassing all possible inputs representing the variable(s) being adjusted.)

Although the use of a prototypical sample for adjustment of a manufacturing process through use of results derived from a neural network generically describes the invention, for pedagogic reasons this invention will be further described with reference to the example of forming a photolithographic mask. In such procedure for typical electron beam acceleration voltages in the range 20 to 40 keV scattering of electron is significant over a distance of in the range 1 $\mu$m to 20 $\mu$m from the point of initial contact of the electron. Additionally such scattering has circular symmetry, i.e. the region that a scattered electron ultimately exposes is arrayed in a circle around the point of impact and has decreasing probability of exposure as the radius of this circle increases.

For a particular set of conditions of beam energy, beam shape and substrate composition, the scattered beam profile, called the proximity function, can be computed by Monte-Carlo techniques as discussed in "Advances in Electronics and Electron Physics", Vol. 69, K. Murata and D. F. Kysen, Chap. 11, Monte Carlo Methods and Microlithography Simulation for Electron and X-ray Beams, p. 175-256, Academic Press, N.Y., 1987, or measured experimentally as described in D. J. Hughes, R. F. Rix, "Proximity Correction on an Electron Scan E-beam Machine by Dose Variation", Pub. Microelectronic Eng., Vol. 9, 1989, p. 243-246. It is possible to complete the exposure dose at any point in the electron sensitive material by performing a two-dimensional convolution of the incident pattern with the proximity function.

One suitable prototypical exposure pattern for an electron beam mask produced with an electron beam energy of 20 keV is shown in FIG. 1. The feature in the upper left is a variable gap ranging from 0.875 $\mu$m to 0.125 $\mu$m in steps of 0.125 $\mu$m. (The upper and lower levels are chosen because they span a range between the smallest resolvable feature and the largest feature affected by the proximity effect. The step size is chosen because it is typical of resolution steps in present-day exposure systems.) The group of rectangles in the top center is 0.5 $\mu$m wide with different spacings ranging from 1 $\mu$m down to 0.25 $\mu$m. At the bottom are a variety of square windows and isolated squares the smallest of which is 0.25 $\mu$m. The feature on the right has a 0.25 $\mu$m gap extending down the center of regions with variable widths. This latter feature ensures compensation for a gap that is near both large and small neighboring features. Thus in this prototypical exposure pattern all the typical geometries experienced in an actual lithographic mask are exemplified, i.e. the input space of mask patterns is represented by the prototype.

Figure 2:
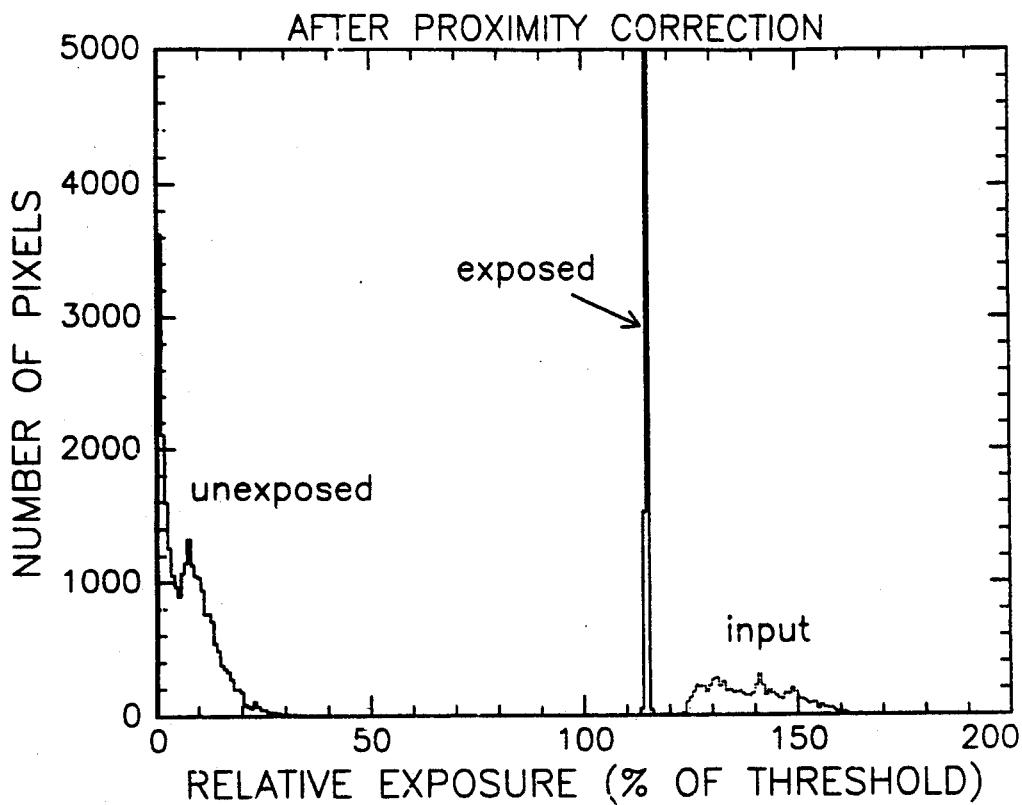
FIGS. 2 and 3 are illustrative of results achievable with the invention.
Figure 3:
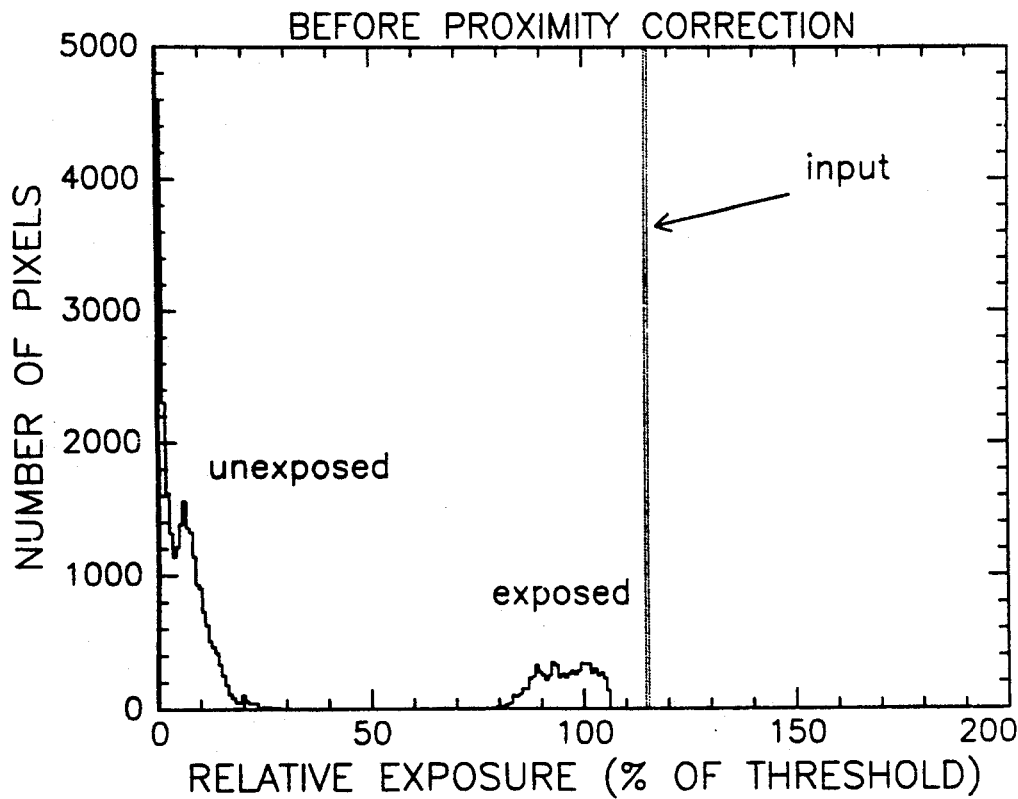

The actual exposure due to both incident and scattered electrons for the production of this pattern was calculated by convolving the incident pattern with a proximity function. Incident dose in nonexposed regions was taken to be zero while incident dose in exposed regions was set, for example, at approximately 115% of the exposure threshold, i.e. the energy required to fully expose the resist of the electron sensitive material to be used in the thickness to be used. A brute force iterative computer process is used to determine the dose adjustment necessary to obtain the desired value of the exposure threshold in all exposed regions after accounting for the scattered electrons. As shown in FIG. 2 (as compared to the uncorrected result of FIG. 3), after correction all exposed pixels receive very nearly the optimum dosage. (A pixel is defined as a minimum resolvable sized dot or element in the image.) Pixels intended to be unexposed receive a small dosage, but since negative amounts of electron dosage are not allowed, this cannot be corrected.

The iterative calculation procedure is performed by calculating the scattered intensity distribution and comparing it with the desired pattern. The difference between the resulting scattered and desired distribution is the error. A dosage equal to the error is substrated from the incident image, and iteration is continued until the error is less than the desired specification for the mask, e.g., less than 2%. Each iteration on the test pattern of 32,400 pixels, i.e. 32,400 sets of input data require about one hour to perform on a computer having a speed of 1 million instructions per second. Since 4 iterations are typically required, this computation time is clearly uneconomic unless, as in the invention, it is used solely to establish the prototypical sample.

Figure 4:
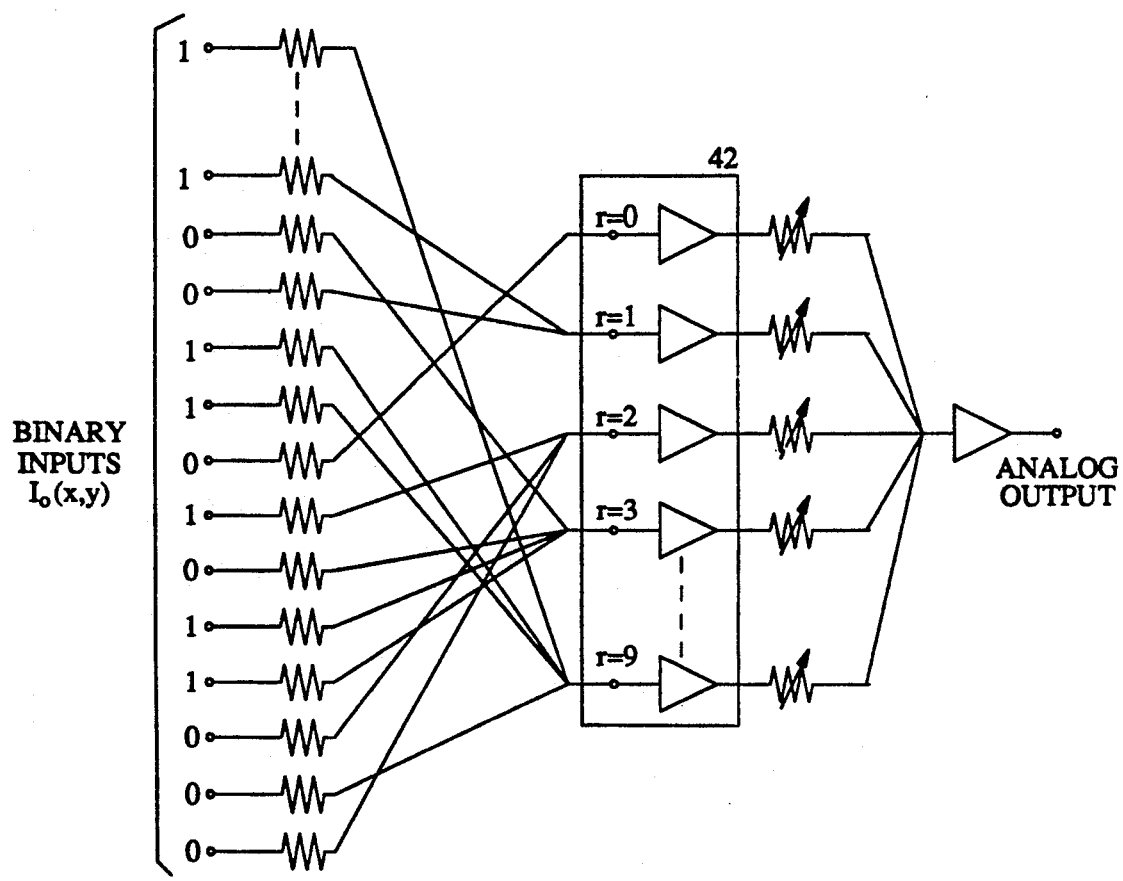
FIG. 4 is illustrative of a neural network suitable for use in the invention.
Figure 5:
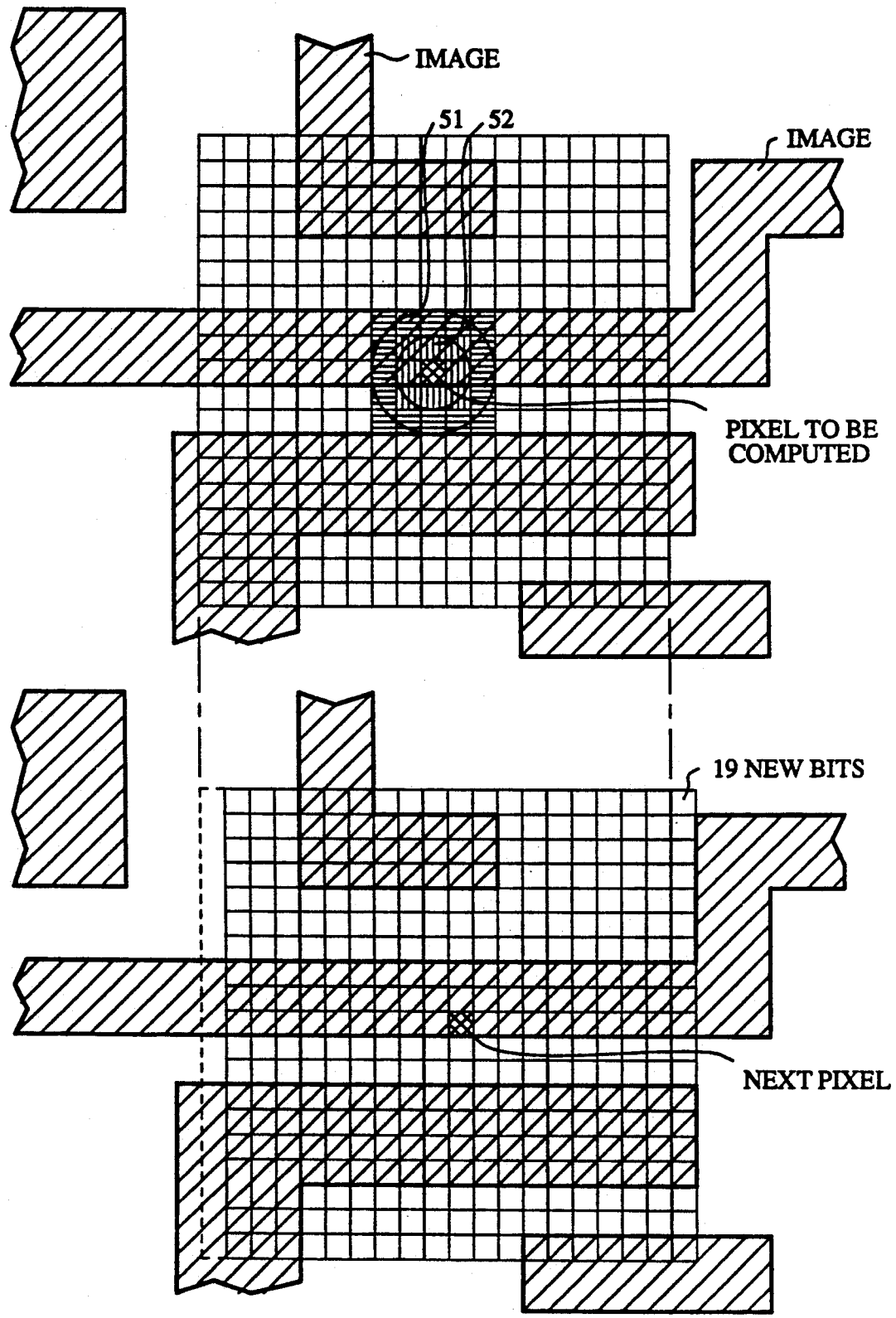
FIG. 5 is illustrative of an article to be produced in the invention.

In this embodiment, since 95% of the scattering occurs within a radius of 1.25 $\mu$m of the point of contact and since the pixel size employed is $\frac{1}{8}\mu$m, the array of meaningful pixels around a point of exposure is represented by a $19 \times 19$ matrix (i.e., the center pixel plus 9 pixels in each direction outward). Thus the neural network for this example should have 361 inputs. (Other examples have different ranges for scattering of electrons and thus different sized arrays are required.) This number of inputs, if all performed simultaneously, would be cumbersome. However, by utilizing digital shift registers, the process is made significantly more manageable. The input data is loaded into the neural network by an array of shift registers corresponding to a digital array of 19 words, each 19 bits long. Each binary input as shown in FIG. 4, corresponding to a pixel is connected through an impedance, e.g., a resistor, to an active device, a voltage following buffer amplifier in this example, associated with a radius of integral pixel length from the point of impact of the central pixel of the array. Thus as shown in FIG. 5 the centers of pixels denominated 51 fall within a radius of one times the pixel dimension while the centers of pixels 52 fall between a radius of one and two times the pixel dimension. In the circuit of FIG. 4, each binary input corresponding to a pixel denominated 51 connects to the amplifier labelled r=1, and each binary input denominated 52 connects to the amplifier labelled r=2, etc.

The value of the impedances connecting the inputs to the buffer amplifiers 42 are not critical and are typically within 100 to $10^6$ ohms. Such values are chosen because low resistances, although resulting in faster operation, consume more power. (If the neural network is implemented in software, clearly such restraints are not present.) For the example of proximity effect, the resistors in the first layers are all identical. By this initial procedure the input to each active device within row 42 is a voltage which is an average sum of the incident exposure dose falling on a ring at a particular radius. The output of each active device from this first group is then directed through a variable impedance again typically having an impedance ranging between 100 and $10^6$ ohms to a second device group which in this embodiment is a current summing amplifier. By setting values of these variable impedances, an appropriate weighting of scattering seen at the central pixel of, for example, the 19×19 array is determined. These variable weights are established by adjusting the variable impedances until the matrix yields the same answer as established in the previously described iterative process for the prototypical sample. Thus, through an empirical process the neural network parameters are established.

During determination of dose adjustment factors for an actual photomask, the neural network with its previously established impedance values is employed. The dose required at each pixel is determined by loading the 19×19 matrix around that pixel into the input of the pre-established neural network with the output of the neural network corresponding to the adjusted dose. The next pixel adjacent to this initially calculated pixel is then calculated by shifting the new pixel into each of the 19 shift registers, corresponding to a shift in the input pattern by 1 pixel, as shown in FIG. 5. The process continues until all the adjustment factors are obtained. Typical time periods for this determination on arrays having 32,000 pixels is 13 sec compared to 4 hours as described for the analytical process. The adjusted values thus determined are then utilized to control the exposure process as a desired photomask process having the desired accuracy specified for computation of the prototypical sample is manufactured.

A corresponding procedure to establish the configuration of a neural network for any manufacturing process utilizing a prototypical sample is possible. The established neural network solution is utilized to adjust the fabrication procedure so that enhanced results relative to an unadjusted process is obtained. The following examples are illustrative of the improvements associated with such adjustments.

EXAMPLE 1

Two arrays of information were needed to perform the computation. The first was the proximity function, PRX(x,y), a two dimensional array that describes the scattering characteristics of the electron beam. This first array was computed by Monte-Carlo techniques. The size of this array depended on the range (in pixels) of the scattering. A range encompassing 95% of the total area under the proximity function generally gave acceptable results. Thus, the array PRX(x,y) was defined from x = −RANGE to x = +RANGE, and similarly for y. The overall dimension of this array, then was (2×RANGE+1) by (2×RANGE+1).

The second array, INPUT(x,y) was a prototype image for a lithographic mask. Its value at each x,y location determined whether or not the pixel was to be exposed. It was a binary array, i.e. each of its values is either 0 or 1, and was significantly larger than RANGE in each of its dimensions x and y. The object of the iterative computation was to generate a new array, IMAGE, that after scattering resulted in an amount of energy DOSE being written into each x,y location for which INPUT(x,y)=1.

The algorithm to compute the correction for INPUT(x,y) was as follows:

STEP 1:

$$IMAGE(x,y) = DOSE \times INPUT(x,y).$$

STEP 2:

The actual scattered dose that results from this input image was found by a two dimensional convolution of the incident pattern with the proximity function.

$$OUTPUT(x, y) = \sum_{m=-RANGE}^{RANGE} \sum_{n=-RANGE}^{RANGE} IMAGE(x - m, y - n) \times PRX(m, n).$$

STEP 3:

The desired output was to have an amount of exposure equal to DOSE in each x,y location where INPUT(x,y) is unity. Thus, the error was defined to be $$ERROR(x,y) = OUTPUT(x,y) - (DOSE \times INPUT(x,y))$$

STEP 4:

A new image $$NEWIMAGE(x,y) = IMAGE(x,y) - ERROR(x,y)$$

was then defined. Since negative amounts of electron exposure are not physically allowed, if NEWIMAGE(x,y) is less than zero, it was set equal to zero. NEWIMAGE(x,y) was then used in place of IMAGE(x,y) and was inserted back into step 2. Steps 2 through 4 were repeated until all of the values of ERROR(x,y) become acceptably small, or until further iterations cease to result in reductions in the overall error.

This basic iterative procedure computed the correction array IMAGE(x,y) for an input array INPUT(x,y) and for the proximity function PRX(x,y). Because scattering occurs over a distance of length RANGE pixels, the computation of the correction for a particular pixel necessarily included all of the pixels within a radius of length RANGE around it.

The neural network shown in FIG. 4 was employed to compute the basic function $$OUTPUT = \sum_{r=0}^{RANGE} W_r \times IAVE(r)$$

where $W_r$ was the adjustable resistances coupling each of the buffer amplifiers 42 to the output current summing amplifier, and IAVE(r) denoted a radial average of the function INPUT(x,y). Computationally, this averaging was done as follows: for a particular pixel at the coordinates (x,y), the radius of surrounding pixels at $(x_0,y_0)$ was conveniently expressed as $$RADIUS = (integer)[(x-x_0)^2 + (y-y_0)]^{\frac{1}{2}}.$$

By defining RADIUS to be only the integral portion of the actual radial distance, i.e. by truncating the fractional parts, pixels were grouped that fall within an annulus having a thickness of one pixel. For a particular value of RADIUS, IAVE(RADIUS) was defined in a software neural network as $$IAVE(RADIUS) = \frac{\text{number of pixels at RADIUS with INPUT}(x, y) = 1}{\text{total number of pixels at RADIUS}}$$

whereas this expression coincides with the voltage at the output of amplifier 42 in a hardware network.

The connection strengths $W_r$ were determined by trial and error, using the delta rule, gradient descent method discussed by Rumelhart, et al., supra. Random values were initially assigned to $W_r$. For a particular input pixel, INPUT(x,y), a corresponding desired output of the network, IMAGE(x,y) was determined using the iterative method. The output of the network, OUTPUT(x,y) was determined from the above three equations. The error in the neural network was defined as $$NETERR(x,y) = IMAGE(x,y) - OUTPUT(x,y).$$

Application of the delta rule gives the change in the weights $W_r$ on the basis of each trial (i.e. each (x,y) point) as $$\Delta W_r = -Eta \times NETERR(x,y) \times IAVE(r)$$

where Eta was a constant of proportionality, typically less than unity. A choice of Eta that was too large in value resulted in divergence of the network, rather than learning. A choice that was too small led to a slower rate of convergence. As this procedure was repeated for many (x,y) in the prototype, NETERR(x,y) became progressively smaller until the network stabilized, generally at a small average error. At this point the training was complete.

When the network had been successfully trained to correct the input for a particular proximity function using an appropriately chosen prototype input, it also performed the appropriate correction of arbitrary inputs. Actual implementation was either as a hardware electronic network, in which the values of $W_r$ are conductances, or as software computing the correction using the above equations with the same values of $W_r$.

We claim:

1. A process for manufacturing an article having desired specifications, said process being complex and comprising the steps of causing a neural network, having parameters determined through a prototypical article so that a solution derived from data representing a variable for said prototypical article yields in said process a resulting article corresponding to said prototypical article that essentially meets said desired specifications, to be applied to data representing a variable of said process, generating a control signal corresponding to the solution derived from said data by said neural network to effect the fabrication of said article, and adjusting said variable in conformance with said signal without adjusting said parameters based on said signal.

2. The process of claim 1 wherein said article comprises an integrated circuit.

3. The process of claim 1 wherein said article comprises a lithographic mask.

4. The process of claim 3 including the step of producing a pattern in an electron sensitive material by selectively exposing said material to electrons.

5. The process of claim 4 wherein said variable comprises the dosage of said electrons produced by control of an electron beam.

6. The process of claim 5 wherein said neural network includes active devices that perform a linear operation.

7. In a process characterized by one or more variables in which a directable energy is directed at a plurality of target locations wherein said energy impacting at one of said plurality of target locations in a body produces an effect at such target locations and also produces an effect at one or more locations in proximity to said target location, the subprocess for achieving the desired effect at each of a plurality of said locations comprising the steps of deriving a solution by applying a representation of said process to a neural network having parameters determined through a prototypical sample without adjustment of said parameters based on said solution, and adjusting for each of said target locations one or more of said variables of said directable energy in accordance with the effect created at said proximate locations.

* * * * *